(12) United States Patent
Hwang et al.

(10) Patent No.: US 12,048,095 B2
(45) Date of Patent: Jul. 23, 2024

(54) CIRCUIT BOARD (71) Applicant: LG INNOTEK CO., LTD., Seoul (KR)

(72) Inventors: Min Young Hwang, Seoul (KR); Moo Seong Kim, Seoul (KR); Byeong Kyun Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 349 days.

(21) Appl. No.: 17/430,708

(22) PCT Filed: Feb. 10, 2020

(86) PCT No.: PCT/KR2020/001805
§ 371 (c)(1),
(2) Date: Aug. 12, 2021

(87) PCT Pub. No.: WO2020/166901
PCT Pub. Date: Aug. 20, 2020

(65) Prior Publication Data
US 2022/0151068 A1 May 12, 2022

(30) Foreign Application Priority Data
Feb. 12, 2019 (KR) .................. 10-2019-0015970

(51) Int. Cl.
*H05K 1/02* (2006.01)
*H05K 1/11* (2006.01)

(52) U.S. Cl.
CPC .......... *H05K 1/113* (2013.01); *H05K 1/0207* (2013.01); *H05K 1/0296* (2013.01); *H05K 2201/096* (2013.01)

(58) Field of Classification Search
None
See application file for complete search history.

(56) References Cited

U.S. PATENT DOCUMENTS 6,441,312 B1 *  8/2002  Tanimura ........... H05K 13/0465
                                                    361/764
8,895,863 B2 * 11/2014  Inaba .................. H05K 1/0207
                                                    174/262
(Continued)

FOREIGN PATENT DOCUMENTS

CN    101621896 A    1/2010
CN    201986254 U    9/2011
(Continued)

OTHER PUBLICATIONS

Office Action dated Aug. 9, 2022 in Japanese Application No. 2021-544586.
International Search Report in International Application No. PCT/KR2020/001805, filed May 25, 2020.
Office Action dated Mar. 29, 2023 in Chinese Application No. 202080014093.7.

*Primary Examiner* — Courtney L Smith
(74) *Attorney, Agent, or Firm* — Saliwanchik, Lloyd & Eisenschenk (57) ABSTRACT

A circuit board according to one embodiment comprises a first insulation layer, a circuit pattern on the first insulation layer, and a second insulation layer on the circuit pattern, wherein a heat transfer member is arranged inside the first insulation layer and/or the second insulation layer, and the heat transfer member is arranged while coming in contact with a side surface of the insulation layer.

19 Claims, 7 Drawing Sheets

(56) References Cited

U.S. PATENT DOCUMENTS

| | | | |
|---|---|---|---|
| 9,166,083 B2 * | 10/2015 | Meinel | H01L 31/024 |
| 9,706,668 B2 | 7/2017 | Kim et al. | |
| 10,362,667 B2 * | 7/2019 | Min | H05K 1/0204 |
| 10,535,581 B2 | 1/2020 | Fujinaga | |
| 2008/0079146 A1 | 4/2008 | Hattori et al. | |
| 2009/0301765 A1 * | 12/2009 | Strauss | H05K 1/0207 |
| | | | 313/46 |
| 2011/0290537 A1 | 12/2011 | Nagase | |
| 2014/0353004 A1 | 12/2014 | Jung et al. | |
| 2014/0355215 A1 * | 12/2014 | Canete | H01L 23/49827 |
| | | | 361/720 |
| 2016/0120060 A1 | 4/2016 | Kim et al. | |
| 2016/0302298 A1 | 10/2016 | Min et al. | |
| 2016/0302299 A1 | 10/2016 | Lee et al. | |
| 2017/0256474 A1 | 9/2017 | Fujinaga | |

FOREIGN PATENT DOCUMENTS

| | | |
|---|---|---|
| CN | 105555014 A | 5/2016 |
| JP | 11-307888 A | 11/1999 |
| JP | 2000-114674 A | 4/2000 |
| JP | 2011-210948 A | 10/2011 |
| JP | 2012-9828 A | 1/2012 |
| JP | 2015-185597 A | 10/2015 |
| JP | 2018-207053 A | 12/2018 |
| KR | 10-2012-0021101 A | 3/2012 |
| KR | 10-1397221 B1 | 5/2014 |
| KR | 10-1463988 B1 | 11/2014 |
| WO | 2016/080333 A1 | 5/2016 |

\* cited by examiner

CIRCUIT BOARD

CROSS-REFERENCE TO RELATED APPLICATIONS

This application is the U.S. national stage application of International Patent Application No. PCT/KR2020/001805, filed Feb. 10, 2020, which claims the benefit under 35 U.S.C. § 119 of Korean Application No. 10-2019-0015970, filed Feb. 12, 2019, the disclosures of each of which are incorporated herein by reference in their entirety.

TECHNICAL FIELD

The present invention relates to a circuit board, and more particularly, to a printed circuit board including an upper conductive layer and a lower conductive layer having different thicknesses at upper and lower portions, and a method of manufacturing the same.

BACKGROUND ART

A printed circuit board (PCB) is formed by printing a circuit line pattern at an electrical insulation substrate with a conductive material such as copper, and thus the PCB refers to a board just before electronic components are mounted thereon. That is, in order to densely mount various types of electronic components on a planar surface, the PCB refers to a circuit board having a planar surface on which a mounting position of each component is fixed and a circuit pattern connecting the components is fixedly printed.

Meanwhile, an amount of heat generated by components is increasing as electronic devices become more high-performance and lighter, thinner, shorter and smaller. In addition, the use of high-voltage high power devices is increasing in accordance with the demand for energy saving, emergence of new renewable energy, and improvement of energy efficiency, and in particular, heat has a significant impact on safety and equipment life in such high power devices. Accordingly, there is an increasing need for a heat dissipating substrate that can effectively transfer heat generated in the device to the inside and outside.

A conventional circuit board often uses epoxy-based polymer resins as an insulation layer. These epoxy resins have excellent insulating properties, strength, and heat resistance, but since the epoxy resins have low thermal conductivity, there is a problem that heat generated by the device connected to the substrate is not effectively transferred.

In addition, since the generated heat is dissipated in only one direction, the heat dissipation efficiency of the circuit board may be reduced, and a region where heat is concentrated in a specific region, that is, a hot spot phenomenon may occur.

Therefore, a circuit board having a new structure capable of improving thermal conductivity and improving heat dissipation effect is required.

DISCLOSURE

Technical Problem

An embodiment is directed to providing a circuit board with improved heat transfer and heat dissipation effects.

Technical Solution

A circuit board according to an embodiment includes: a first insulation layer; a circuit pattern on the first insulation layer; and a second insulation layer on the circuit pattern, wherein a heat transfer member is disposed inside at least one of the first insulation layer and the second insulation layer, and the heat transfer member is disposed in contact with a side surface of the insulation layer.

Advantageous Effects

The circuit board according to the embodiment may effectively transfer heat and dissipate heat inside the insulation layer.

In detail, heat transfer in the horizontal direction as well as in the vertical direction inside the insulation layer may be increased to increase heat dispersion inside the insulation layer, and thus, the overall heat distribution inside the insulation layer may be uniform.

That is, the circuit board according to the embodiment may implement heat transfer in multiple directions, thereby effectively dispersing heat.

In addition, the heat transfer member may not only transfer heat but also dissipate heat from the circuit board to the outside.

Accordingly, it is possible to inhibit the performance of the electronic component from deteriorating due to an increase in the temperature of the circuit board by reducing the heat remaining inside the circuit board.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a circuit board according to embodiments will be described with reference to drawings.

Meanwhile, a vertical direction described below may be defined as a direction in which insulation layers are stacked, and a horizontal direction may be defined as a direction perpendicular to the vertical direction.

Figure 1:
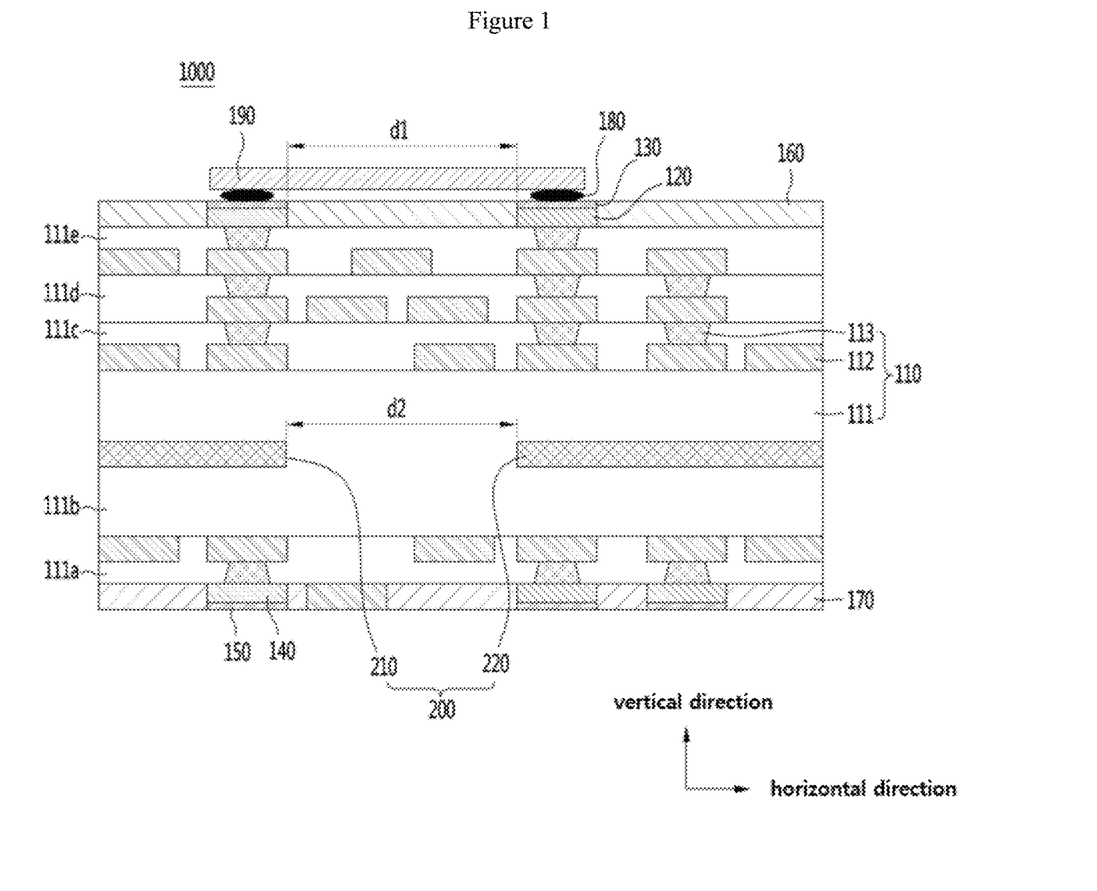
FIG. 1 is a view illustrating a cross-sectional view of a circuit board according to an embodiment.

Referring to FIG. 1, a circuit board according to an embodiment may include an insulation substrate 110, a first pad 120, a first upper metal layer 130, a second pad 140, a second upper metal layer 150, a first passivation layer 160, a second passivation layer 170, a solder paste 180, and an electronic component 190.

The insulation substrate 110 may have a flat plate structure. The insulation substrate 110 may be a printed circuit board (PCB). Here, the insulation substrate 110 may be implemented as a single substrate, and alternatively, may be implemented as a multilayer substrate in which a plurality of insulation layers are sequentially stacked.

Figure 2:
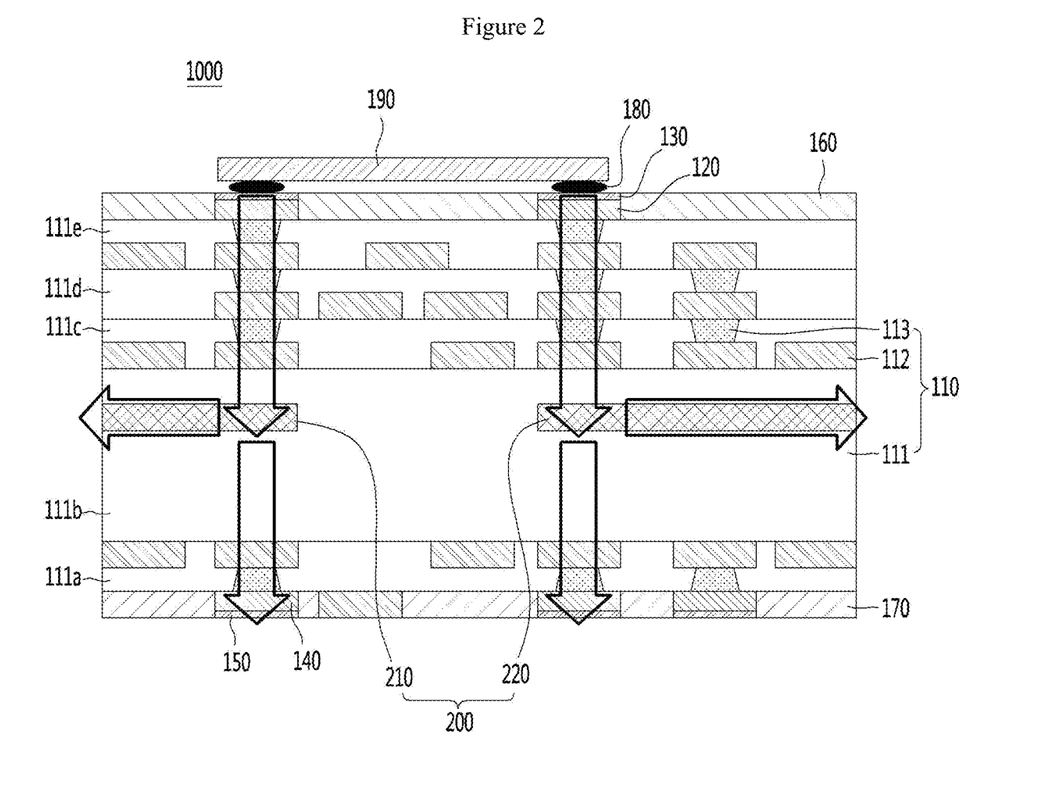
FIG. 2 is a view illustrating heat flow in the circuit board according to an embodiment.

Accordingly, the insulation substrate 110 includes a plurality of insulation layers 111. As shown in FIG. 2, the plurality of insulation layers 111 may include a first insulation layer 111a, a second insulation layer 111b, a third insulation layer 111c, a fourth insulation layer 111d, and a fifth insulation layer 111e from an uppermost portion. In addition, a circuit pattern 112 may be disposed at each of surfaces of the first to fifth insulation layers.

The plurality of insulation layers 111 is a substrate on which an electrical circuit capable of changing wirings is disposed and may include all of printing, a wiring plate, and an insulation substrate which are formed of an insulation material which is able to form the circuit pattern 112 at a surface of the insulation layer.

The plurality of insulation layers 111 may be rigid or flexible. For example, the insulation layer 111 may include glass or plastic. Specifically, the insulation layer 111 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the insulation layer 111 may include an optically isotropic film. For example, the insulation layer 111 may include cyclic olefin copolymer (COC), cyclic olefin polymer (COP), optically isotropic PC, optically isotropic polymethylmethacrylate (PMMA), etc.

Further, the insulation layer 111 may be partially bent while having a curved surface. That is, the insulation layer 111 may partially have a plane and may partially be bent while having a curved surface. Specifically, an end portion of the insulation layer 111 may be bent while having a curved surface, or bent or crooked while having a surface with a random curvature.

Furthermore, the insulation layer 111 may be a flexible substrate having flexibility. Further, the insulation layer 111 may be a curved or bent substrate. In this case, the insulation layer 111 may represent a wiring layout for electrical wirings which connect circuit components based on a circuit design, and electrical conductors may be disposed on an insulation material. Furthermore, electrical components may be mounted on the insulation layer 111, and the insulation layer 111 may form wirings configured to connect the electrical components to make a circuit, and may mechanically fix the components besides functioning to electrically connect the components.

Meanwhile, a heat transfer member 200 may be disposed on at least one of the first to fifth insulation layers. The heat transfer member 200 will be described in detail below.

Each of the circuit patterns 112 is disposed at the surface of the insulation layer 111. The circuit pattern 112 may be a wiring for transmitting an electrical signal, and may be formed of a metal material having high electrical conductivity. To this end, the circuit pattern 112 may be formed of at least one metal material selected from among gold (Au), silver (Ag), platinum (Pt), titanium (Ti), tin (Sn), copper (Cu), and zinc (Zn).

In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit pattern 112 may be formed of copper (Cu) having high electrical conductivity and a relatively low cost.

The circuit pattern 112 may be formed by a general process of manufacturing a PCB, such as an additive process, a subtractive process, a modified semi additive process (MSAP), a semi additive process (SAP), etc., and detailed descriptions thereof will be omitted herein.

At least one via 113 is formed in the insulation layer 111. The via 113 is disposed to be passing through at least one of the plurality of insulation layers 111. The via 113 may pass through only one of the plurality of insulation layers 111, and alternatively, may be formed to commonly pass through at least two insulation layers of the plurality of insulation layers 111. Accordingly, the via 113 electrically connects circuit patterns disposed at surfaces of different insulation layers to each other.

The via 113 may be formed by filling, with a conductive material, a through hole (not shown) passing through at least one of the plurality of insulation layers 111.

The through hole may be formed by any one of mechanical, laser, and chemical processing. When the through hole is formed by mechanical processing, a method such as milling, drilling and routing may be used. When the through hole is formed by laser processing, a method of UV or $CO_2$ laser may be used. And when the through hole is formed by chemical processing, the insulation layer 111 may be opened by using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulation layer, and the $CO_2$ laser is a laser capable of processing only an insulation layer.

When the through hole is formed, the via 113 is formed by filling the inside of the through hole with a conductive material. The metal material forming the via 113 may be anyone selected from among copper (Cu), silver (Ag), tin (Sn), gold (Au), nickel (Ni), and palladium (Pd). The conductive material may be filled by any one of electroless plating, electrolytic plating, screen printing, sputtering, evaporation, ink jetting, and dispensing, or a combination thereof.

The first pad 120 is disposed on the insulation layer disposed at the uppermost portion of the plurality of insulation layers 111 and the second pad 140 is disposed under the insulation layer disposed at the lowermost portion of the plurality of insulation layers 111.

In other words, the first pad 120 is disposed on the uppermost insulation layer 111 in which the electronic component 190 is to be formed, among the plurality of insulation layers 111. The first pad 120 may be formed in plural on the uppermost insulation layer. In addition, a part of the first pad 120 may serve as a pattern for signal transmission and the other part thereof may serve as an inner lead electrically connected to the electronic component 190 through the wire and the like. In other words, the first pad 120 may include a wire-bonding pad for wire bonding.

In addition, the second pad 140 is disposed under the lowermost insulation layer to which an external substrate (not shown) is to be attached, among the plurality of insulation layers 111. Like the first pad 120, a part of the second pad 140 also serves as a pattern for signal transmission, and the other part thereof may serve as an outer lead in which the adhesive member 175 is disposed for attachment of the external substrate. In other words, the second pad 140 includes a soldering pad for soldering.

In addition, the first upper metal layer 130 is disposed on the first pad 120 and the second upper metal layer 150 is disposed under the second pad 140. The first upper metal layer 130 and the second upper metal layer 150 are formed of the same material and increase characteristics of the wire bonding or soldering while protecting the first pad 120 and the second pad 140, respectively.

To this end, the first upper metal layer 130 and the second upper metal layer 150 are formed of a metal including gold (Au). Preferably, the first upper metal layer 130 and the second upper metal layer 150 may include pure gold (purity of 99% or more) only, or may be formed of an alloy including gold (Au). When the first upper metal layer 130 and the second upper metal layer 150 are formed of an alloy including gold, the alloy may be formed of a gold alloy including cobalt.

The solder paste 180 is disposed at the uppermost insulation layer among the plurality of insulation layers. The solder paste is an adhesive for fixing the electronic component 190 attached to the insulation substrate 110. Accordingly, the solder paste 180 may be defined to as an adhesive. The adhesive may be a conductive adhesive, or alternatively, the adhesive may be a non-conductive adhesive. That is, the printed circuit board 100 may be a substrate to which the electronic component 190 is attached in a wire-bonding manner, so that a terminal (not shown) of the electronic component 190 may not be disposed on the adhesive. In addition, the adhesive may not be electrically connected to the electronic component 190. Therefore, a non-conductive adhesive may be used as the adhesive, or alternatively, a conductive adhesive may be used as the adhesive.

The conductive adhesive is largely classified into an anisotropic conductive adhesive and an isotropic conductive adhesive, and is basically composed of conductive particles such as Ni, Au/polymer, or Ag, and thermosetting and thermoplastic resins, or a blend type insulation resin mixing characteristics of the two resins.

In addition, the non-conductive adhesive may also be a polymeric adhesive and may preferably be a non-conductive polymer adhesive including a thermosetting resin, a thermoplastic resin, a filler, a curing agent, and a curing accelerator.

Further, the first passivation layer 160, through which at least a part of a surface of the first upper metal layer 130 is exposed, is disposed on the uppermost insulation layer. The first passivation layer 160 is disposed to protect the surface of the uppermost insulation layer, and, for example, may be a solder resist.

In addition, the solder paste 180 is disposed on the first upper metal layer 130 so that the first pad 120 and the electronic component 190 may be electrically connected to each other.

Here, the electronic component 190 may include both a device and a chip. The device may be classified into an active device and a passive device. The active device refers to a device that positively uses non-linear characteristics. The passive device refers to a device that does not use non-linear characteristics even though both linear and non-linear characteristics are present. In addition, the active device may include a transistor, an IC semiconductor chip, and the like and the passive device may include a condenser, a resistor, an inductor, and the like. The passive device is mounted on a substrate together with an ordinary semiconductor package in order to increase a signal processing speed of a semiconductor chip which is an active device, perform a filtering function, or the like.

As a result, the electronic component 190 may include all of a semiconductor chip, a light emitting diode chip, and other driving chips.

In addition, a resin molding part may be formed on the uppermost insulation layer, and accordingly, the electronic component 190 and the first upper metal layer 130 may be protected by the resin molding part.

Meanwhile, the second passivation layer 170 is disposed under the lowermost insulation layer among the plurality of insulation layers. The second passivation layer 170 has an opening exposing a surface of the second upper metal layer 150. The second passivation layer 170 may be formed of a solder resist.

Hereinafter, the plurality of insulation layers 111 and the heat transfer member disposed inside the insulation layer will be described in detail.

As described above, the insulation layer may include the first insulation layer 111*a*, the second insulation layer 111*b*, the third insulation layer 111c, the fourth insulation layer 111d, and the fifth insulation layer 111e from the lowermost portion thereof.

The heat transfer member 200 may be disposed at least one insulation layer of the first insulation layer 111a, the second insulation layer 111b, the third insulation layer 111c, the fourth insulation layer 111d, and the fifth insulation layer 111e.

For example, referring to FIG. 1, the heat transfer member 200 may be disposed inside the second insulation layer 111b. The heat transfer member 200 may be inserted into the second insulation layer 111b.

As an example, the second insulation layer 111b may be an insulation layer having a different thickness from the other insulation layers. For example, the second insulation layer 111b may be an insulation layer having a thickness greater than those of the other insulation layers. Alternatively, the second insulation layer 111b may be an insulation layer having a thickness smaller than those of the other insulation layers. That is, the second insulation layer 111b may be an insulation layer having a thickness greater than that of at least one of the other insulation layers, or may be an insulation layer having a thickness smaller than that of at least one of the other insulation layers.

The heat transfer member 200 may include a material having high thermal conductivity. In detail, the heat transfer member 200 may include a material having a higher thermal conductivity than the insulation layer. For example, the heat transfer member 200 may include a material having a thermal conductivity of about 50 W/mk to about 500 W/mk. As an example, the heat transfer member 200 may include at least one metal selected from gold (Au), silver (Ag), platinum (Pt), titanium (Ti), tin (Sn), copper (Cu), and zinc (Zn).

The heat transfer member 200 may be disposed to extend in one direction inside the insulation layer. For example, the heat transfer member 200 may extend in a horizontal direction of the circuit board. That is, the heat transfer member 200 may be disposed to extend in the horizontal direction of the circuit board so that heat is transferred from the circuit board in a horizontal direction.

In detail, the heat transfer member 200 may include a first heat transfer member 210 extending in a first direction and a second heat transfer member 220 extending in a direction different from the first direction.

The first heat transfer member 210 may be disposed to extend in one end direction of the second insulation layer 111b. In addition, the second heat transfer member 220 may be disposed to extend in the other end direction of the second insulation layer 111b.

That is, the heat transfer member 200 may include a plurality of heat transfer members 200 extending in a direction of both ends of the second insulation layer 111b.

That is, the heat transfer member 200 may be formed in a bar shape, but the embodiment is not limited thereto.

When heat generated when the electronic component 190 is driven flows into the circuit board and moves into the insulation layer, the heat transfer member 200 may effectively disperse the heat inside the insulation layer.

In detail, referring to FIG. 2, the heat flowing into the circuit board due to the heat generated by the electronic component 190 may be moved toward a lower insulation layer through the circuit pattern and vias.

At this time, since the insulation layer includes a resin material such as epoxy having a thermal conductivity of about 0.5 W/mk or less, there is a problem that heat flowing into the insulation layer is difficult to be effectively dispersed inside the insulation layer.

That is, since the insulation layer itself includes a material having low thermal conductivity, most of the heat flowing into the circuit board is transferred only in one direction. That is, heat transferred in the vertical direction may be very high compared to heat transferred in the horizontal direction.

Accordingly, the heat inside the insulation layer may not be dispersed and the heat may be concentrated in a specific region inside the insulation layer, and reliability of electronic components and performance of a chip may be deteriorated due to a hot spot phenomenon in which such heat is concentrated. In addition, other components connected to the circuit board may be affected.

In order to solve this problem, the circuit board according to the embodiment may disperse the heat transferred into the insulation layer in a plurality of directions by disposing a heat transfer member having high thermal conductivity inside the insulation layer.

That is, the heat flowing into the insulation layer may be dispersed in the vertical and horizontal directions of the insulation layer, so that the heat flowing into the insulation layer may be effectively dispersed.

Meanwhile, the first heat transfer member 210 and the second heat transfer member 220 may be disposed to extend in a direction parallel to one surface of the insulation layer, but the embodiment is not limited thereto, and at least one of the first heat transfer member 210 and the second heat transfer member 220 may extend while having a certain angle with respect to the one surface of the insulation layer.

Figure 3:
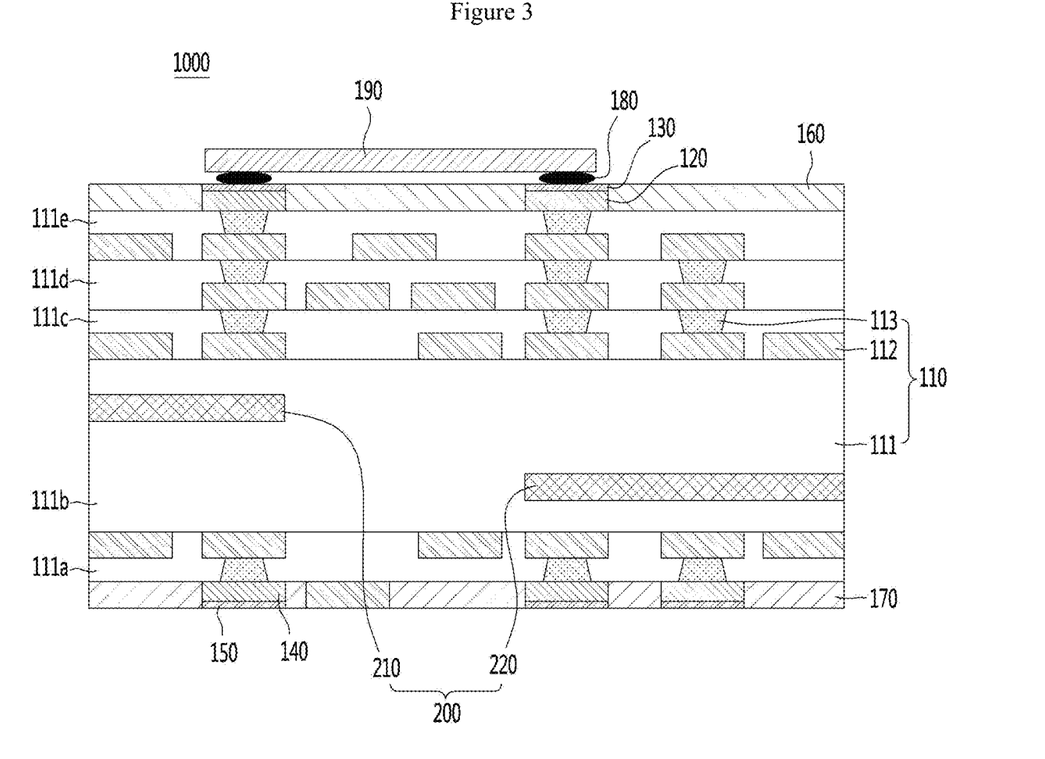
FIG. 3 is a view illustrating another cross-sectional view of the circuit board according to an embodiment.

In addition, referring to FIG. 3, the first heat transfer member 210 and the second heat transfer member 220 may not overlap each other in the horizontal direction of the insulation layer unlike FIG. 1. That is, the first heat transfer member 210 and the second heat transfer member 220 may be disposed to cross each other in the horizontal direction of the insulation layer.

In addition, the first heat transfer member 210 and the second heat transfer member 220 may be disposed to be spaced apart from each other in the insulation layer.

In detail, one end of the first heat transfer member 210 may correspond to a region where the first pad 120 on which the electronic component 190 is mounted is disposed. In addition, one end of the second heat transfer member 220 may correspond to a region where the second pad 140 on which the electronic component 190 is mounted is disposed.

That is, one end of the first heat transfer member 210 may be located in a region perpendicular to a region where one pad portion is disposed, and one end of the second heat transfer member 220 may be located in a region perpendicular to the region where the one pad portion and the other pad portion are disposed.

That is, a separation distance d2 between the first heat transfer member 210 and the second heat transfer member 220 may be separated by a distance similar to a separation distance d1 between the first pad 120 and the second pad 140.

That is, as one ends of the first heat transfer member 210 and the second heat transfer member 220 correspond in a vertical direction to the regions where the first pad 120 and the second pad 140 are disposed, the heat transferred from the first pad 120 and the second pad 140 to the inside of the insulation layer may be effectively dispersed in the first heat transfer member 210 and the second heat transfer member 220.

Meanwhile, the first heat transfer member 210 and the second heat transfer member 220 extending in the directions of one end and the other end of the insulation layer may extend to one end surface and the other end surface of the insulation layer. In detail, the first heat transfer member 210 extends in the one end direction of the second insulation layer 111b and may be in contact with one end surface of the second insulation layer 111b, and the second heat transfer member 220 may extend in the other end direction of the second insulation layer 111b and may be in contact with the other end surface of the second insulation layer 111b.

That is, the first heat transfer member 210 may extend in the first direction and may be in contact with one side surface of the insulation layer, and the second heat transfer member 220 may extend in a direction different from the first direction and may be in contact with the other side surface of the insulation layer.

Accordingly, heat transferred through the first heat transfer member 210 and the second heat transfer member 220 may be discharged to the outside of the circuit board. That is, the heat transfer member 200 may simultaneously perform a heat transfer function and a heat dissipation function.

Meanwhile, at least one insulation layer of the first to fifth insulation layers may include inorganic particles. In detail, at least one insulation layer of the first to fifth insulation layers includes inorganic particles of aluminum oxide ($Al_2O_3$), silicon nitride (SiN), silicon dioxide ($SiO_2$), or boron nitride (BN).

These inorganic particles may serve to improve thermal conductivity of the insulation layer, so that heat inside the circuit board together with the heat transfer member may be effectively dispersed.

Hereinafter, a circuit board according to another embodiment will be described with reference to FIG. 4.

Figure 4:
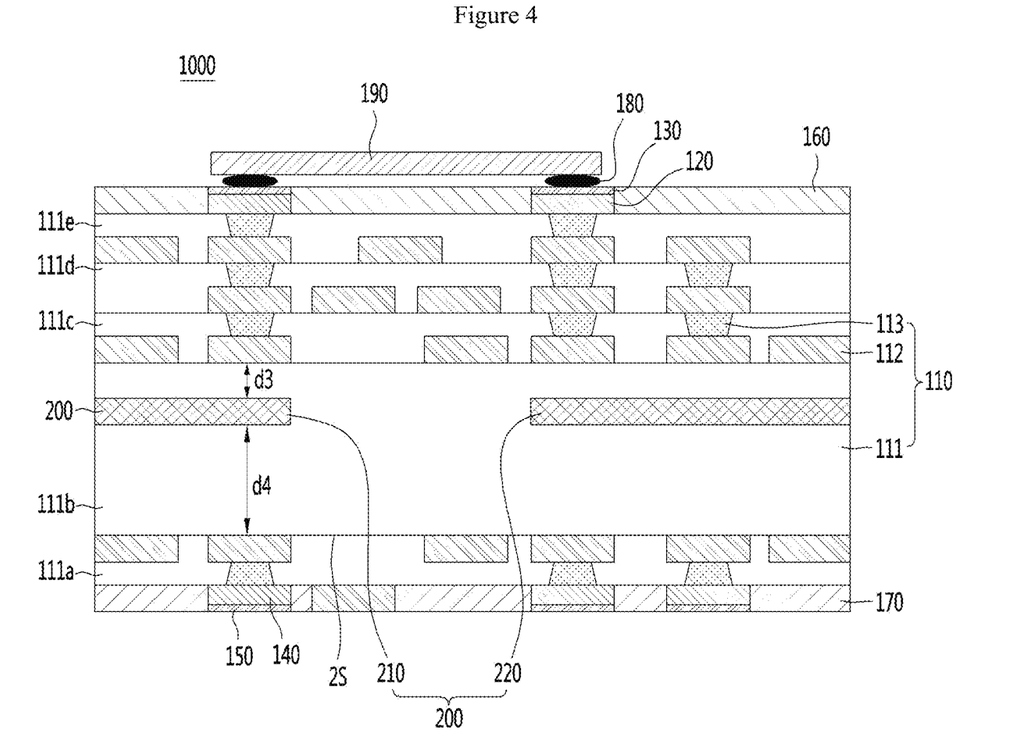
FIG. 4 is a view illustrating a cross-sectional view of a circuit board according to another embodiment.

Referring to FIG. 4, in the circuit board according to another embodiment, unlike the above-described embodiment, a position of a heat transfer member 200 may be formed in an upper region of the insulation layer.

In detail, the circuit board according to another embodiment may be disposed in an upper region of the second insulation layer 111b so that the heat transfer member 200 is close to the first pad portion 120 and the second pad portion 140 based on a vertical direction of the second insulation layer 111b.

In detail, the second insulation layer 111b may include one surface is close to the first pad portion 120 and the second pad portion 140 and the other surface 2s opposite to the one surface 1s. The heat transfer member 200 may be disposed closer to the one surface 1s than the other surface 2s.

In other words, a third distance d3 between the heat transfer member 200 and the one surface 1s may be smaller than a fourth distance d4 between the heat transfer member 200 and the other surface 2s.

Accordingly, since heat transferred from the third insulation layer 111c toward the second insulation layer 111b may be effectively dispersed in a horizontal direction from an upper portion of the second insulation layer 111b, it is possible to inhibit a phenomenon in which heat is concentrated in a specific region due to a difference in distribution of heat in upper and lower regions of the second insulation layer 111b.

Hereinafter, a circuit board according to still another embodiment will be described with reference to FIG. 5.

Figure 5:
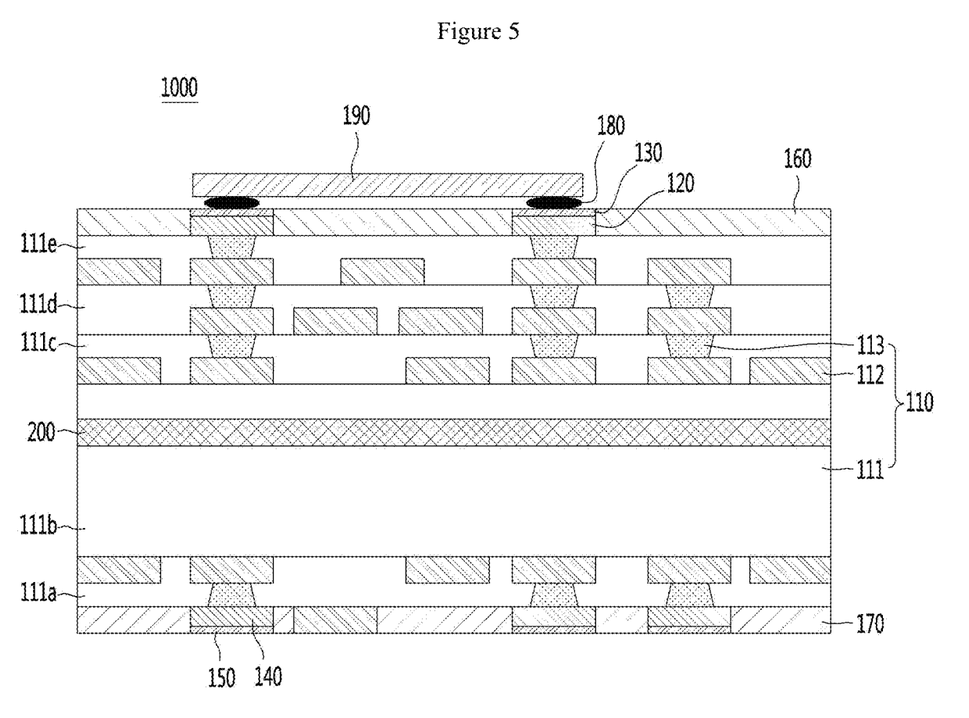
FIG. 5 is a view illustrating a cross-sectional view of a circuit board according to still another embodiment.

Referring to FIG. 5, in the circuit board according to still another embodiment, unlike the above-described embodiment, a heat transfer member 200 may be integrally formed.

In detail, the heat transfer member 200 may be disposed so that the first heat transfer member 210 and the second heat transfer member 220 are in contact with each other. Alternatively, the heat transfer member may not include two heat transfer members, but may include one heat transfer member extending in the direction of one end and the other end of the insulation layer. That is, the first heat transfer member 210 and the second heat transfer member 220 may be integrally formed.

Accordingly, the circuit board according to still another embodiment may not include a region where the first heat transfer member 210 and the second heat transfer member 220 are spaced apart from each other. That is, all heat transfer members may be disposed in the horizontal direction inside the insulation layer.

Accordingly, concentration of heat that may occur between the first heat transfer member 210 and the second heat transfer member 220 may be inhibited according to the separation distance between the first heat transfer member 210 and the second heat transfer member 220.

Hereinafter, a circuit board according to yet another embodiment will be described with reference to FIG. 6.

Figure 6:
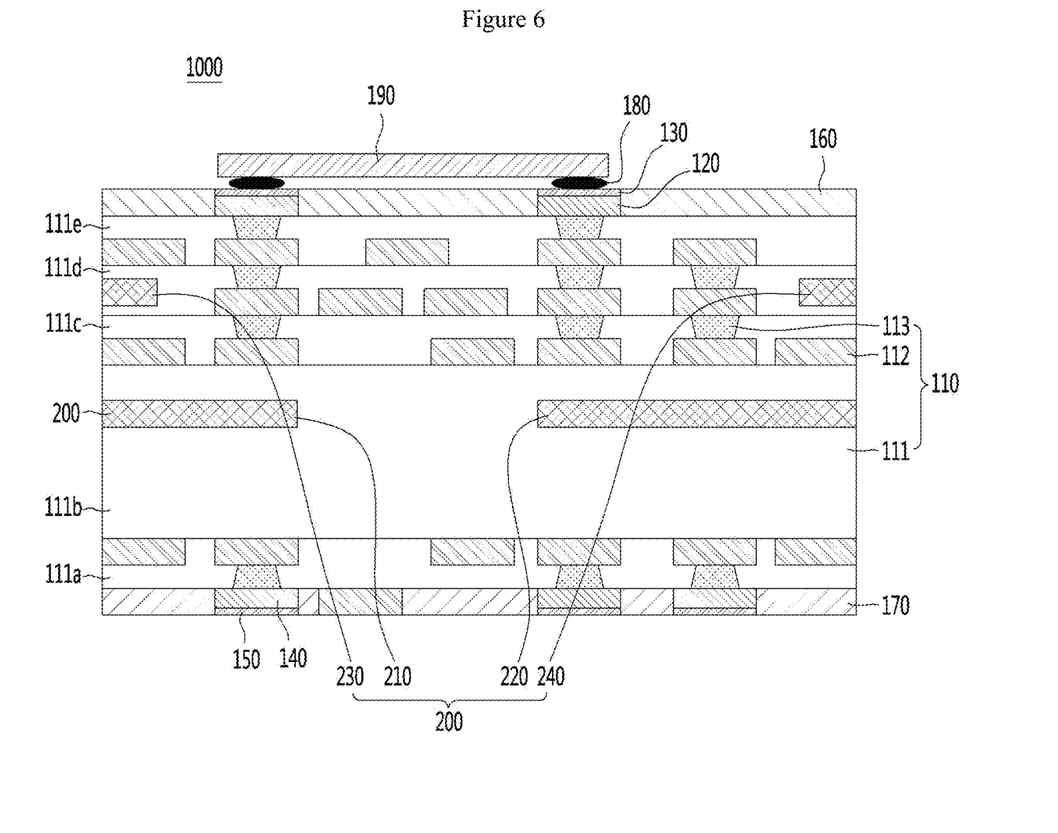
FIG. 6 is a view illustrating a cross-sectional view of a circuit board according to yet another embodiment.

Referring to FIG. 6, in the circuit board according to yet another embodiment, unlike the above-described embodiment, a heat transfer member 200 may be disposed inside a plurality of insulation layers.

In detail, the heat transfer member 200 may include a first heat transfer member 210, a second heat transfer member 220, a third heat transfer member 230, and a fourth heat transfer member 240.

The first heat transfer member 210 and the second heat transfer member 220 may be disposed inside the second insulation layer 111b. In addition, the third heat transfer member 230 and the fourth heat transfer member 240 may be disposed on an insulation layer other than the second insulation layer 111b.

Meanwhile, in the drawing, it is shown that the first heat transfer member 210 and the second heat transfer member 220 are formed to be longer than the third heat transfer member 230 and the fourth heat transfer member 240, but the embodiment is not limited thereto, and the heat transfer member may be formed to have the same length, or the third heat transfer member 230 and the fourth heat transfer member 240 may be formed to be longer than the first heat transfer member 210 and the second heat transfer member 220.

As an example, the third heat transfer member 230 and the fourth heat transfer member 240 may be disposed inside the fourth insulation layer 111d. However, the embodiment is not limited thereto, and the third heat transfer member 230 and the fourth heat transfer member 240 may be disposed on other insulation layers other than the second and fourth insulation layers, or when fifth and sixth heat transfer members are further included, a heat transfer member may be disposed inside three or more insulation layers.

Accordingly, in the circuit board according to yet another embodiment, since the heat transfer member is disposed inside the plurality of insulation layers, a temperature difference between the respective insulation layers may be reduced. Accordingly, it is possible to reduce the temperature difference between the respective insulation layers and inhibit an increase in temperature in a specific insulation layer, thereby minimizing an occurrence of warpage or deformation in the circuit board.

Hereinafter, a circuit board according to yet another embodiment will be described with reference to FIG. 7.

Figure 7:
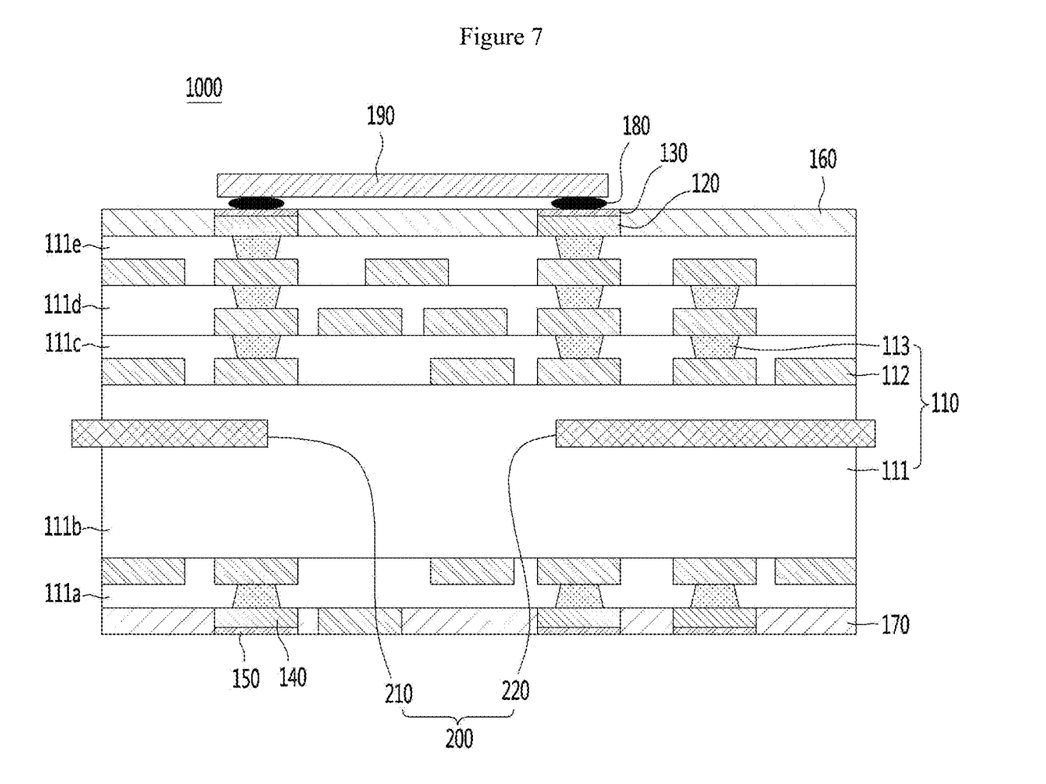
FIG. 7 is a view illustrating a cross-sectional view of a circuit board according to yet another embodiment.

Referring to FIG. 7, in the circuit board according to yet another embodiment, unlike the above-described embodiment, a heat transfer member 200 may be formed to extend to the outside of the insulation layer.

In detail, the first heat transfer member 210 and the second heat transfer member 220 may be formed while penetrating a side surface of the second insulation layer 111b, and accordingly, the first heat transfer member 210 and the second heat transfer member 220 may be formed to protrude from the side surface of the insulation layer.

Accordingly, it is possible to inhibit an increase in temperature due to the remaining heat by the heat transfer member in one region of the side surface of the insulation layer, and it is possible to inhibit the heat dissipation effect from being reduced because the heat transfer member is not in contact with the side surface according to a process error.

In addition, design freedom may be improved by forming the heat transfer member so as to protrude in a lateral direction.

The circuit board according to the embodiment may effectively transfer heat and dissipate heat inside the insulation layer.

In detail, heat transfer in the horizontal direction as well as in the vertical direction inside the insulation layer may be increased to increase heat dispersion inside the insulation layer, and thus, the overall heat distribution inside the insulation layer may be uniform.

That is, the circuit board according to the embodiment may implement heat transfer in multiple directions, thereby effectively dispersing heat.

In addition, the heat transfer member may not only transfer heat but also dissipate heat from the circuit board to the outside.

Accordingly, it is possible to inhibit the performance of the electronic component from deteriorating due to an increase in the temperature of the circuit board by reducing the heat remaining inside the circuit board.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that the contents related to such a combination and such a modification are included in the scope of the embodiments.

In addition, the above description has been focused on the embodiments, but it is merely illustrative and does not limit the present invention. Those skilled in the art to which the embodiments pertain may appreciate that various modifications and applications not illustrated above are possible without departing from the essential features of the embodiment. For example, each component particularly represented in the embodiments may be modified and realized. In addition, it should be construed that differences related to such a modification and an application are included in the scope of the present invention defined in the appended claims.

The invention claimed is:

1. A circuit board comprising:
a first insulation layer;
a circuit pattern on the first insulation layer;
a second insulation layer on the circuit pattern;
a plurality of pad portions disposed on the second insulation layer and spaced apart from each other;
a first heat transfer member disposed inside the first insulation layer; and
a second heat transfer member is-disposed inside the second insulation layer,
wherein the first insulation layer includes one surface close to the pad portion and an other surface opposite to the one surface,
wherein a distance between the heat transfer member and the one surface is smaller than a distance between the heat transfer member and the other surface, and
wherein a thickness of the first insulation layer is greater than a thickness of the second insulation layer.

2. The circuit board of claim 1, wherein the first heat transfer member and the second heat transfer member are disposed to be spaced apart from each other,
the first heat transfer member extends in a first direction and is in contact with one side surface of the first insulation layer, and
the second heat transfer member extends in a direction different from the first direction and is in contact with an other side surface of the first insulation layer.

3. The circuit board of claim 1, wherein the first heat transfer member and the second heat transfer member are in contact with each other, and
the first heat transfer member and the second heat transfer member are integrally formed.

4. The circuit board of claim 2, wherein one end of the first heat transfer member is located in a region perpendicular to a region where one pad portion is disposed, and
one end of the second heat transfer member is located in a region perpendicular to the region where the one pad portion and another pad portion are disposed.

5. The circuit board of claim 1, wherein the first heat transfer member is disposed in contact with a side surface of the second insulation layer.

6. The circuit board of claim 2, comprising a third heat transfer member and a fourth heat transfer member that are disposed inside the second insulation layer.

7. The circuit board of claim 1, wherein at least one insulation layer of the first insulation layer and the second insulation layer includes inorganic particles.

8. The circuit board of claim 2, wherein the first heat transfer member is formed to protrude outward from one side surface of the first insulation layer, and
the second heat transfer member is formed to protrude outward from the other side surface of the first insulation layer.

9. The circuit board of claim 1, wherein thermal conductivity of at least one of the first heat transfer member and the second heat transfer member is greater than that of the first insulation layer and the second insulation layer.

10. The circuit board of claim 1, wherein at least one of the first heat transfer member and the second heat transfer member includes a metal.

11. The circuit board of claim 6, wherein lengths of the first heat transfer member and the second heat transfer member are greater than lengths of the third heat transfer member and the fourth heat transfer member.

12. The circuit board of claim 1, wherein at least one of the first heat transfer member and the second heat transfer member includes a material having a thermal conductivity of 50 W/mk to 500 W/mk.

13. The circuit board of claim 1, wherein at least one of the first heat transfer member and the second heat transfer member includes at least one metal among gold (Au), silver (Ag), platinum (Pt), titanium (Ti), tin (Sn), copper (Cu), and zinc (Zn).

14. The circuit board of claim 2, wherein the first heat transfer member and the second heat transfer member are disposed to cross each other in a horizontal direction.

15. The circuit board of claim 7, wherein the inorganic particles include at least one of aluminum oxide (Al2O3), silicon nitride (SiN), silicon dioxide (SiO2), and boron nitride (BN).

16. The circuit board of claim 2, wherein the first heat transfer member is disposed passing through one side surface of the first insulation layer, and
the second heat transfer member is disposed passing through the other side surface of the first insulation layer.

17. The circuit board of claim 16, wherein the first heat transfer member is disposed to protrude with respect to the one side surface,
the second heat transfer member is disposed to protrude with respect to the other side surface, and
lengths of the first heat transfer member and the second heat transfer member disposed inside the first insulation layer are greater than lengths of the protruding first heat transfer member and the second heat transfer member.

18. The circuit board of claim 2, comprising
a component disposed on the pad portion,
wherein a width of the component is greater than a distance between the first heat transfer member and the second heat transfer member.

19. The circuit board of claim 1, comprising
a third insulation layer to a fifth insulation layer on the second insulation layer, and
a heat transfer member disposed inside the third insulation layer to the fifth insulation layer.

* * * * *